(12) United States Patent
Tsuyama et al.

(10) Patent No.: US 9,868,864 B2
(45) Date of Patent: Jan. 16, 2018

(54) ELECTROCONDUCTIVE-FILM-FORMING COMPOSITION AND METHOD FOR PRODUCING ELECTROCONDUCTIVE FILM

(71) Applicant: FUJIFILM Corporation, Tokyo (JP)

(72) Inventors: Hiroaki Tsuyama, Kanagawa (JP); Toru Watanabe, Kanagawa (JP); Yuuichi Hayata, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/002,464

(22) Filed: Jan. 21, 2016

(65) Prior Publication Data

US 2016/0137855 A1    May 19, 2016

Related U.S. Application Data

(63) Continuation of application No. PCT/JP2014/065569, filed on Jun. 12, 2014.

(30) Foreign Application Priority Data

Jul. 29, 2013   (JP) .................................. 2013-156621

(51) Int. Cl.
| | |
|---|---|
| C09D 5/24 | (2006.01) |
| C09D 1/00 | (2006.01) |
| C09D 7/12 | (2006.01) |
| C09D 201/00 | (2006.01) |
| H01B 1/22 | (2006.01) |
| H05K 1/09 | (2006.01) |
| C23C 18/08 | (2006.01) |

(52) U.S. Cl.
CPC .................. *C09D 5/24* (2013.01); *C09D 1/00* (2013.01); *C09D 7/12* (2013.01); *C09D 201/00* (2013.01); *C23C 18/08* (2013.01); *H01B 1/22* (2013.01); *H05K 1/097* (2013.01); *H05K 2203/1157* (2013.01)

(58) Field of Classification Search
CPC .......... C09D 1/00; C09D 201/00; C09D 5/24; C09D 7/12; H01B 1/22; H05K 1/097; H05K 2203/1157
See application file for complete search history.

(56) References Cited

U.S. PATENT DOCUMENTS

| 2005/0069648 A1 | 3/2005 | Maruyama |
| 2011/0183068 A1 | 7/2011 | Yamakawa et al. |

FOREIGN PATENT DOCUMENTS

| CN | 101232963 A | 7/2008 |
| JP | 2007-080720 A | 3/2007 |
| JP | 2008-166590 A | 7/2008 |
| JP | 4804083 B2 | 10/2011 |
| TW | 201022153 A | 6/2010 |
| WO | 03-051562 A1 | 6/2003 |
| WO | 2010-047350 A1 | 4/2010 |

OTHER PUBLICATIONS

International Search Report; PCT/JP2014/065569; dated Sep. 22, 2014.
The First Office Action issued by the State Intellectual Property Office of People's Republic of China on Oct. 11, 2016, which corresponds to Chinese Patent Application No. 201480037398.4 and is related to U.S. Appl. No. 15/002,464; with English language translation.
Notification of Transmittal of Translation of the International Preliminary Report on Patentability and Translation of Written Opinion of the International Searching Authority; PCT/JP2014/065569 dated Feb. 11, 2016.
The extended European search report issued by the European Patent Office on Jun. 14, 2016, which corresponds to European Patent Application No. 14832874.3-1302 and is related to U.S. Appl. No. 15/002,464.
CN Office Action dated Mar. 27, 2017 from corresponding CN Appl No. 201480037398.4, with English translation, 16 pages.
An Office Action; "Notification of Reasons for Refusal," issued by the Japanese Patent Office dated Nov. 8, 2016, which corresponds to Japanese Patent Application No. 2013-156621 and is related to U.S. Appl. No. 15/002,464; with English language translation.
An Office Action; "Decision of Refusal" issued by the Japanese Patent Office dated May 30, 2017, which corresponds to Japanese Patent Application No. 2013-156621 and is related to U.S. Appl. No. 15/002,464; with English language translation.
An Office Action issued by Taiwan Patent Office dated Jun. 27, 2017, which corresponds to Taiwanese Patent Application No. 103123235 and is related to U.S. Appl. No. 15/002,464.
An Office Action issued by the Chinese Patent Office (SIPO) dated Sep. 26, 2017, which corresponds to Chinese Patent Application No. 201480037398.4 and is related to U.S. Appl. No. 15/002,464; with English language translation.

*Primary Examiner* — Mark Kopec
*Assistant Examiner* — Jaison P Thomas
(74) *Attorney, Agent, or Firm* — Studebaker & Brackett PC

(57) ABSTRACT

An electroconductive-film-forming composition capable of forming an electroconductive film having excellent conductivity and few voids and a method for producing an electroconductive film using the same. The electroconductive-film-forming composition contains copper particles having an average particle diameter of 1 nm to 10 μm, copper oxide particles having an average particle diameter of 1 nm to 500 nm, a reducing agent having a hydroxy group, a metal catalyst including metals other than copper, and a solvent, in which the content of the copper oxide particles is 50% by mass to 300% by mass with respect to the content of the copper particles, the content of the reducing agent is 100 mol % to 800 mol % with respect to the content of the copper oxide particles, and the content of the metal catalyst is 10% by mass or less with respect to the content of the copper oxide particles.

20 Claims, No Drawings

ELECTROCONDUCTIVE-FILM-FORMING COMPOSITION AND METHOD FOR PRODUCING ELECTROCONDUCTIVE FILM

CROSS-REFERENCE TO RELATED APPLICATIONS

This application is a continuation of PCT International Application No. PCT/JP2014/065569 filed on Jun. 12, 2014, which claims priority under 35 U.S.C. §119(a) to Japanese Patent Application No. 2013-156621 filed on Jul. 29, 2013. Each of the above applications is hereby expressly incorporated by reference, in its entirety, into the present application.

BACKGROUND OF THE INVENTION

1. Field of the Invention

The present invention relates to an electroconductive-film-forming composition and a method for producing an electroconductive film using the same.

2. Description of the Related Art

As a method for forming an electroconductive film on a substrate, a technique of forming an electroconductive portion such as wiring on an electroconductive film or a circuit board by applying a dispersion of metal particles or metal oxide particles to a substrate by a printing method, subjecting the dispersion to a heat treatment, and sintering the dispersion has been known.

The above method is simple and saves energy and resources compared to the conventional wiring preparation method performed by high temperature vacuum processing (sputtering) or a plating treatment, and thus the method is regarded as a highly promising technique for the development of next-generation electronics.

For example, WO2003/51562A discloses a dispersion including copper oxide particles, copper particles, and a polyhydric alcohol, and a thin metal film obtained by sintering the dispersion (claims).

SUMMARY OF THE INVENTION

However, when conducting research on a composition containing copper particles, copper oxide particles, a reducing agent having a hydroxy group, and a solvent with reference to WO2003/51562A, the present inventors have found that the conductivity of an electroconductive film to be obtained is not sufficient or voids are formed in an electroconductive film to be obtained. When voids are formed in the electroconductive film, deterioration in conductivity and durability is caused and thus a problem arises.

The present invention has been made in consideration of the above circumstances, and an object thereof is to provide an electroconductive-film-forming composition capable of forming an electroconductive film having excellent conductivity and few voids and a method for producing an electroconductive film using the same.

As a result of conducting intensive research to solve the problems, the present inventors found that an electroconductive-film-forming composition capable of forming an electroconductive film having excellent conductivity and few voids is obtained by formulating a metal catalyst including metals other than copper and setting the content of each component to be in a specific range, and based on this finding, the present invention has been accomplished. That is, the present inventors have found that the aforementioned problems can be solved by the following constitution.

(1) An electroconductive-film-forming composition containing copper particles having an average particle diameter of 1 nm to 10 μm, copper oxide particles having an average particle diameter of 1 nm to 500 nm, a reducing agent having a hydroxy group, a metal catalyst including metals other than copper, and a solvent, in which the content of the copper oxide particles is 50% by mass to 300% by mass with respect to the content of the copper particles, the content of the reducing agent is 100 mol % to 800 mol % with respect to the content of the copper oxide particles, and the content of the metal catalyst is 10% by mass or less with respect to the content of the copper oxide particles.

(2) The electroconductive-film-forming composition according to (1), in which the reducing agent is a compound having two or more hydroxy groups in a molecule.

(3) The electroconductive-film-forming composition according to (2), in which the boiling point of the reducing agent is 250° C. or lower and the reducing agent is a compound represented by Formula (1) or (2) which will be described later.

(4) The electroconductive-film-forming composition according to any one of (1) to (3), in which the metal catalyst is a metal catalyst including at least one metal selected from the group consisting of palladium, platinum, nickel, and silver.

(5) The electroconductive-film-forming composition according to any one of (1) to (4), in which the metal catalyst is a salt compound.

(6) The electroconductive-film-forming composition according to any one of (1) to (5), in which the solubility parameter (SP value) of the solvent is 10 $(cal/cm^3)^{1/2}$ to 20 $(cal/cm^3)^{1/2}$.

(7) The electroconductive-film-forming composition according to any one of (1) to (6), further containing a resin.

(8) The electroconductive-film-forming composition according to (7), in which the resin is a thermosetting resin.

(9) A method for producing an electroconductive film including: a coating film forming step of forming a coating film by applying the electroconductive-film-forming composition according to any one of (1) to (8) to a substrate, and a heat treatment step of forming an electroconductive film by subjecting the coating film to a heat treatment.

(10) The method for producing an electroconductive film according to (9), in which the temperature of the heat treatment is 200° C. or lower.

As will be described later, according to the present invention, it is possible to provide an electroconductive-film-forming composition capable of forming an electroconductive film having excellent conductivity and few voids, and a method for producing an electroconductive film using the same.

DESCRIPTION OF THE PREFERRED EMBODIMENTS

[Electroconductive-Film-Forming Composition]

An electroconductive-film-forming composition of the present invention (hereinafter, also simply referred to as a composition of the present invention) contains copper particles having an average particle diameter of 1 nm to 10 μm, copper oxide particles having an average particle diameter of 1 nm to 500 nm, a reducing agent having a hydroxy group, a metal catalyst including metals other than copper, and a solvent.

Here, the content of the copper oxide particles is 50% by mass to 300% by mass with respect to the content of the copper particles, the content of the reducing agent is 100 mol % to 800 mol % with respect to the content of the copper oxide particles, and the content of the metal catalyst is 10% by mass or less with respect to the content of the copper oxide particles.

It is considered that when the composition of the present invention has such a constitution, an electroconductive film to be obtained has excellent conductivity and few voids.

Although the details are not clear, it is assumed as follows.

The composition of the present invention contains copper oxide particles, copper particles, and a reducing agent having a hydroxy group. Thus, when energy such as heat or light is applied to a coating film formed from the composition, the copper oxide particles are reduced by the reducing agent and the reduced copper oxide particles are fused to the copper particles. Here, since the composition of the present invention contains a metal catalyst together with the reducing agent, the reducing reaction of the copper oxide particles easily proceeds and fusion of the copper reduced from the copper oxide particles to the copper particles effectively proceeds. As a result, it is considered that an electroconductive film having excellent conductivity and few voids is formed. This is assumed from the fact that, as shown in Comparative Examples which will be described later, in a case of not containing a copper oxide (Comparative Example 7), a case in which a copper oxide is contained in the composition but the content of copper oxide particles does not reach a fixed amount with respect to the content of copper particles (Comparative Example 1), and a case of not containing a metal catalyst (Comparative Examples 5 and 6), the conductivity of the electroconductive film is not sufficient and a large number of voids are observed.

In addition, the composition of the present invention is characterized in that the content of each component is specified. That is, since the content of the reducing agent with respect to the content of the copper oxide particles is a fixed amount or more, reduction of the copper oxide particles homogeneously proceeds over the entire system. In addition, since the content of the reducing agent and the content of the metal catalyst are fixed amounts or less, the reducing agent and the metal catalyst do not easily remain as resistance components after the reduction. As a result, it is considered that an electroconductive film having excellent conductivity and few voids is formed. This is assumed from the fact that, as shown in Comparative Examples which will be described later, in a case in which the content of a reducing agent does not reach a fixed amount (Comparative Example 3) and a case in which the content of a reducing agent or a metal catalyst is more than a fixed amount (Comparative Examples 2 and 4), the conductivity of the electroconductive film is not sufficient and a large number of voids are observed.

Hereinafter, first, each component of the electroconductive-film-forming composition will be described in detail and then a method for producing an electroconductive film will be described in detail.

<Copper Particles>

The copper particles contained in the composition of the present invention are not particularly limited as long as the copper is granular copper having an average particle diameter of 1 nm to 10 μm.

The term "granular" refers to a small particle shape and specific examples thereof include a spherical shape and an elliptical shape. The shape is not necessarily a completely round or elliptical shape and a part thereof may be deformed.

The average particle diameter of the copper particles is not particularly limited as long as the average particle diameter is in a range of 1 nm to 10 However, in the above range, the average particle diameter is preferably 100 nm to 8 μm and more preferably 1 μm to 5 μm.

The average particle diameter used in the present invention refers to an average primary particle diameter. The average particle diameter is obtained by measuring the particle diameters (diameters) of at least 50 or more copper particles through observation using a transmission electron microscope (TEM) and arithmetically averaging the values of the diameters. In the observed image, when the shape of the copper particles is not completely a round shape, the major axis is measured as a diameter.

In the composition of the present invention, the content of the copper particles is preferably 2% by mass to 60% by mass and more preferably 5% by mass to 50% by mass with respect to the total amount of the composition. In addition, the content of the copper particles is preferably 5% by mass to 80% by mass and more preferably 10% by mass to 70% by mass with respect to the total solid content of the composition.

<Copper Oxide Particles>

The copper oxide particles contained in the composition of the present invention is not particularly limited as long as the copper oxide is a granular copper oxide having an average particle diameter of 1 nm to 500 nm. The definition of the term "granular" is the same as the definition of the term "granular" of the copper particles.

The copper oxide particles are preferably copper (I) oxide particles ($Cu_2O$ particles) or copper (II) oxide particles ($CuO$ particles) and more preferably copper (II) oxide particles from the viewpoint of availability at a low cost and stability in the air.

The average particle diameter of the copper oxide particles is not particularly limited as long as the average particle diameter is within a range of 1 nm to 500 nm. The average particle diameter is preferably 5 nm to 300 nm and more preferably 10 nm to 100 nm. The measurement method of the average particle diameter is the same as the measurement method of the average particle diameter of the copper particles.

In the composition of the present invention, the content of the copper oxide particles is preferably 2% by mass to 60% by mass and more preferably 5% by mass to 50% by mass with respect to the total amount of the composition. In addition, the content of the copper oxide particles is preferably 5% by mass to 80% by mass and more preferably 10% by mass to 70% by mass with respect to the total solid content of the composition.

In the composition of the present invention, the content of the copper oxide particles is 50% by mass to 300% by mass with respect to the content of the copper particles. In the above range, the content is preferably 80% by mass to 200% by mass.

When the content of the copper oxide particles is more than 300% by mass with respect to the content of the copper particles, reduction of the copper oxide does not sufficiently proceed and the conductivity is not sufficient. In addition, when the content of the copper oxide particles is less than 50% by mass with respect to the content of the copper particles, the number of voids is increased resulting from insufficient fusion between the copper particles, and the conductivity is not sufficient.

<Reducing Agent>

The reducing agent contained in the composition of the present invention is a reducing agent having a hydroxy group (hereinafter, simply referred to as a reducing agent) and is not particularly limited as long as the reducing agent is obtained by reducing the copper oxide particles or the copper oxide on the surface of the copper particles. For example, materials which are decomposed by producing carbon or hydrogen by application of energy such as a heat treatment or a light irradiation treatment can be preferably used. Among these, a reducing agent which does not exhibit reducibility to the copper oxide particles substantially at room temperature but exhibits reducibility by application of energy (latent reducing agent) is preferable.

Examples of the reducing agent include alcohols such as 1-decanol; ascorbic acid; sugar alcohols such as erythritol, xylitol, ribitol, and sorbitol; saccharides such as erythrose, xylose, ribose, glucose, fructose, mannose, galactose, and glyceraldehyde; hydroxy ketones such as hydroxyacetone and dihydroxyacetone; amino alcohols such as 1-amino-2,3-propanediol and 2-amino-1,3-propanediol; polyhydric alcohols such as ethylene glycol, propylene glycol, 1,2-butanediol, 2,3-butanediol, 1,2-pentanediol, 1,2-hexanediol, 1,2-heptanediol, 3,4-heptanediol, 1,2-octanediol, glycerin, trimethylolpropane, pentaerythritol, dipentaerythritol, and tripentaerythritol; glyoxylic acid; glycolic acid; and polyethylene oxide.

The reducing agent is preferably a compound having two or more hydroxy groups in a molecule for the reason that an electroconductive film to be obtained can exhibit further excellent conductivity. Examples of such a compound include polyhydric alcohols including the aforementioned sugar alcohols, and saccharides.

Among these, a compound having a boiling point of 250° C. or lower and represented by Formula (1) or (2) below is preferable for the reason that an electroconductive film to be obtained can exhibit further excellent conductivity. The boiling point is preferably 150° C. to 220° C. Here, the boiling point is a boiling point under 1 atm.

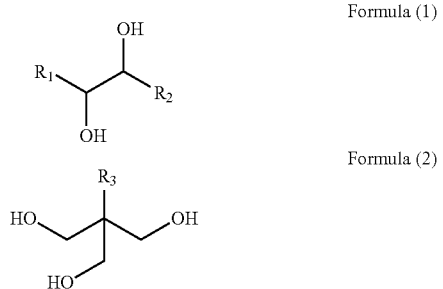

In Formulae (1) and (2), $R_1$, $R_2$ and $R_3$ each independently represent a hydrogen atom, an alkyl group, an alkoxy group, a hydroxyalkyl group, or an alkoxyalkyl group. Herein, $R_1$, $R_2$ and $R_3$ do not contain an aldehyde group or a carbonyl group. That is, $R_1$, $R_2$ and $R_3$ do not include groups having an aldehyde group (—CHO) or a carbonyl group (—CO—) as a substituent.

The number of carbon atoms in the alkyl group, the alkoxy group, the hydroxyalkyl group, and the alkoxyalkyl group is not particularly limited and is preferably 1 to 10 and more preferably 1 to 5.

The hydroxyalkyl group is an alkyl group having a hydroxy group as a substituent. Specific examples of the hydroxyalkyl group include a hydroxymethyl group, a hydroxyethyl group, and a hydroxypropyl group. The hydroxyalkyl group may be an alkyl group having plural hydroxy groups as substituents.

The alkoxyalkyl group is an alkyl group having an alkoxy group (preferably having 1 to 5 carbon atoms) as a substituent. Specific examples of the alkoxyalkyl group include a methoxymethyl group, a methoxypropyl group, and an ethoxyethyl group. The alkoxyalkyl group may be an alkyl group having plural alkoxy groups as substituents.

$R_1$ and $R_2$ are preferably a hydrogen atom or an alkyl group having 1 to 5 carbon atoms.

$R_3$ is preferably an alkyl group having 1 to 5 carbon atoms.

In the composition of the present invention, the content of the reducing agent is preferably 5% by mass to 60% by mass and more preferably 10% by mass to 50% by mass with respect to the total amount of the composition. In addition, the content of the reducing agent is preferably 10% by mass to 90% by mass and more preferably 20% by mass to 80% by mass with respect to the total solid content of the composition.

In the composition of the present invention, the content of the reducing agent is 100 mol % to 800 mol % with respect to the content of the copper oxide particles. That is, a value obtained by dividing the number of moles of the reducing agent by the number of moles of the copper oxide is 100% to 800%. Here, the number of moles of the copper oxide is a value obtained by dividing the mass [g] of the copper oxide particles by the molar mass of the copper oxide (for example, in the case of copper (I) oxide, the molar mass is 143.09 g/mol, and in the case of copper (II) oxide, the molar mass is 79.55 g/mol). The content of the reducing agent is preferably 200 mol % to 700 mol % with respect to the content of the copper oxide particles.

When the content of the reducing agent is more than 800 mol % with respect to the content of the copper oxide particles, the reducing agent not contributing to the reduction may remain in the electroconductive film as an insulating component, and thus the conductivity is not sufficient. Further, the number of voids is increased. When the content of the reducing agent is less than 100 mol % with respect to the content of the copper oxide particles, reduction of the copper oxide particles does not proceed sufficiently. Thus, the conductivity is not sufficient and the number of voids is increased.

In the case in which the reducing agent is a solvent which will be described later, the reducing agent also functions as the solvent which will be described later. That is, in the case in which the reducing agent is a solvent which will be described later, the composition may contain or may not contain solvents other than the reducing agent.

<Metal Catalyst>

The metal catalyst contained in the composition of the present invention is not particularly limited as long as the metal catalyst contains metals (metal elements) other than copper. Examples of such a metal catalyst include metal particles including metals other than copper (preferably fine palladium particles, fine platinum particles, and fine nickel particles), and metal compounds including metals other than copper. Among these, metal compounds including metals other than copper are preferable. The valence of the metal included in the metal catalyst is preferably greater than 0. In the case in which the metal catalyst does not contain metals other than copper, the reducing reaction of the copper oxide particles hardly proceeds and as a result, the conductivity of the electroconductive film is not sufficient and the number of voids is increased.

Metals other than copper are not particularly limited and examples thereof include alkali metals, alkaline earth metals, transition metals other than copper (group 3 to 11 metals other than copper), aluminum, germanium, tin, and antimony. Among these, for the reason that an electroconductive film to be obtained can exhibit further excellent conductivity, transition metals other than copper are preferable. Among these, group 8 to 11 metals other than copper are preferable for the reason that an electroconductive film to be obtained can exhibit further excellent conductivity. At least one metal selected from the group consisting of palladium, platinum, nickel and silver is more preferable and at least one metal selected from the group consisting of palladium, platinum, and nickel is still more preferable. Palladium or platinum is particularly preferable and palladium is most preferable.

Metal compounds including metals other than copper are not particularly limited and examples thereof include salt compounds of metals other than copper, complex compounds, metal alkoxides, metal aryloxides, and metal oxides. Among these, salt compounds of metals other than copper are preferable for the reason that an electroconductive film to be obtained can exhibit further excellent conductivity and homogeneousness.

Examples of the salt compounds include hydrochlorides of metals other than copper, nitrates, sulfates, carboxylates, sulfonates, phosphates, and phosphonates. Among these, carboxylates are preferable. The number of carbon atoms of carboxylic acid constituting carboxylates is not particularly limited and is preferably 1 to 10 and more preferably 1 to 5.

In the composition of the present invention, the content of the metal catalyst is preferably 0.05% by mass to 10% by mass and more preferably 0.1% by mass to 1.0% by mass with respect to the total amount of the composition. In addition, the content of the metal catalyst is preferably 0.1% by mass to 15% by mass and more preferably 0.2% by mass to 5% by mass with respect to the total solid content of the composition.

In the composition of the present invention, the content of the metal catalyst is more than 0% by mass and 10% by mass or less with respect to the content of the copper oxide particles. Among these, the content of the metal catalyst is 0.5% by mass to 10% by mass, more preferably 1% by mass to 10% by mass, and still more preferably 3% by mass to 10% by mass.

When the content of the metal catalyst is more than 10% by mass with respect to the content of the copper oxide particles, an excessive amount of the metal catalyst functions as a resistance component. Thus, the conductivity is not sufficient and the number of voids is increased.

In the composition of the present invention, it is preferable to dissolve the contained metal catalyst in a solvent which will be described later from the viewpoint of achieving further excellent conductivity of an electroconductive film to be obtained.

<Solvent>

The solvent contained in the composition of the present invention is not particularly limited. The solvent may be a single solvent of one solvent, or a mixed solvent of two or more solvents.

The type of the solvent is not particularly limited and for example, organic solvents such as water, alcohols, ethers, and esters can be used.

As the solvent, from the viewpoint of having handleability and weak reducibility, alcohol, water, or a mixed solvent including alcohol and water is preferable.

The solubility parameter (SP value) of the solvent contained in the composition of the present invention is not particularly limited. The solubility parameter is preferably 10 $(cal/cm^3)^{1/2}$ to 20 $(cal/cm^3)^{1/2}$ and more preferably 12 $(cal/cm^3)^{1/2}$ to 18 $(cal/cm^3)^{1/2}$ for the reason that an electroconductive film to be obtained can exhibit further excellent conductivity.

Herein, the solubility parameter of the solvent is a parameter defined by the regular solution theory introduced by Hildebrand and more specifically, when $\Delta H$ indicates the molar heat of vaporization of the solvent and V indicates the molar volume, the solubility parameter is an amount $(cal/cm^3)^{1/2}$ defined by $(\Delta H/V)^{1/2}$.

When the solvent is a mixed solvent of two or more solvents, the solubility parameter of the solvent is the sum of products of the volume fraction of each mixed solvent and the solubility parameter of each solvent. For example, the solubility parameter of a mixed solvent obtained by mixing water (SP value: 23.4) and acetone (SP value: 10.0) at water/acetone=0.5/0.5 (volume ratio) is 23.4×0.5+10.0× 0.5=16.7.

Examples of a solvent having a SP value of 10 $(cal/cm^3)^{1/2}$ to 20 $(cal/cm^3)^{1/2}$ include acetone (10.0), isopropanol (11.5), acetonitrile (11.9), dimethylformamide (12.0), diethylene glycol (12.1), acetic acid (12.6), ethanol (12.7), cresol (13.3), formic acid (13.5), ethylene glycol (14.6), phenol (14.5), methanol (14.8), and glycerin (16.5). The values in parentheses represent SP values.

In the composition of the present invention, the content of the solvent is not particularly limited but from the viewpoint of suppressing an increase in viscosity and achieving excellent handleability, the content of the solvent is preferably 10% by mass to 80% by mass and more preferably 30% by mass to 60% by mass with respect to the total amount of the composition.

<Other Components>

The composition of the present invention may include components other than the above-described respective components.

For example, the composition of the present invention may include a surfactant. The surfactant has a function of improving dispersibility of the copper oxide particles and/or the copper particles. The type of the surfactant is not particularly limited and examples thereof include an anionic surfactant, a cationic surfactant, a nonionic surfactant, a fluorochemical surfactant, and an ampholytic surfactant. These surfactants can be used alone or in mixture of two or more.

(Resin)

The composition of the present invention preferably includes a resin.

The resin is not particularly limited and examples thereof include a thermoplastic resin and a thermosetting resin. Among these, for the reason that the number of voids of an electroconductive film to be obtained is further decreased, the resin is preferably a thermosetting resin.

The thermosetting resin is not particularly limited and known thermosetting resins can be used. It is preferable that the thermosetting resin is a resin that gelates by a heat treatment at 200° C. for 30 minutes.

Examples of the thermosetting resin include phenol resins (particularly resol resins), epoxy resins, melamine resins, polyamide imide resins, polyimide resins, isocyanate resins, and siloxane resins. Two or more thermosetting resins may be used together. In addition, a curing agent may be formulated according to the thermosetting resin to be used. Further, other resins such as polyvinyl butyral resins and rubber resins may be formulated.

In the composition of the present invention, the content of the thermosetting resin is preferably 0.1% by mass to 30% by mass and more preferably 0.5% by mass to 15% by mass with respect to the total amount of the composition. In addition, the content of the thermosetting resin is preferably 0.5% by mass to 40% by mass and more preferably 1% by mass to 20% by mass with respect to the total solid content of the composition.

In the composition of the present invention, the content of the thermosetting resin is not particularly limited and for the reason that an electroconductive film to be obtained can exhibit further excellent conductivity, the content the thermosetting resin is preferably 1% by mass to 40% by mass with respect to the total content of the copper particles and the copper oxide particles. In the above range, the content of the thermosetting resin is more preferably 5% by mass to 20% by mass.

<Viscosity of Electroconductive-Film-Forming Composition>

It is preferable to adjust the viscosity of the composition of the present invention to be suitable for printing such as ink jet and screen printing. In the case of performing an ink jet ejection operation, the viscosity is preferably 1 cP to 50 cP and more preferably 1 cP to 40 cP. In the case of performing screen printing, the viscosity is preferably 1,000 cP to 100,000 cP and more preferably 10,000 cP to 80,000 cP.

<Method for Preparing Electroconductive-Film-Forming Composition>

The method for preparing the composition of the present invention is not particularly limited and a known method can be adopted. For example, the composition can be prepared by adding each of the above-described components in the solvent, and then dispersing the components by known means such as an ultrasonic method (for example, a treatment using an ultrasonic homogenizer), a mixer method, a three-roll method, and a ball mill method.

[Method for Producing Electroconductive Film]

A method for producing an electroconductive film of the present invention is a method for producing an electroconductive film using the aforementioned composition of the present invention. The method for producing an electroconductive film of the present invention is not particularly limited as long as the composition of the present invention is used.

As a suitable embodiment of the method for producing an electroconductive film of the present invention, a method including at least a coating film forming step and a heat treatment step may be used. Hereinafter, each step will be described in detail.

<Coating Film Forming Step>

This step is a step of forming a coating film by applying the aforementioned composition of the present invention to a substrate. Through this step, a precursor film is formed before a heat treatment is performed.

As the substrate used in this step, a known substrate can be used. Examples of materials used in the substrate include resins, paper, glass, silicon-based semiconductors, compound semiconductors, metal oxides, metal nitrides, wood, or a composite material thereof.

Specific examples thereof include resin substrates such as a low density polyethylene resin, a high density polyethylene resin, an ABS resin, an acrylic resin, a styrene resin, a vinyl chloride resin, a polyester resin (polyethylene terephthalate), a polyacetal resin, a polysulfone resin, a polyether imide resin, a polyether ketone resin, and a cellulose derivative; paper substrates such as non-coated printing paper, ultra light weight coated paper, coated printing paper (art paper and coat paper), special printing paper, copying paper (PPC paper), unbleached packaging paper (unglazed kraft paper for heavy-duty sacks and unglazed kraft paper), bleached packaging paper (bleached kraft paper and pure-white roll paper), coated cardboard, chipboard paper, and corrugated cardboard; glass substrates such as soda-lime glass, borosilicate glass, silica glass, and quartz glass; silicon-based semiconductor substrates such as amorphous silicon and polysilicon; compound semiconductor substrates such as CdS, CdTe, and GaAs; metal substrates such as a copper plate, an iron plate and an aluminum plate; other inorganic substrates such as alumina, sapphire, zirconia, titania, yttrium oxide, indium oxide, indium tin oxide (ITO), indium zinc oxide (IZO), NESA (tin oxide), antimony-doped tin oxide (ATO), fluorine-doped tin oxide, zinc oxide, aluminum-doped zinc oxide (AZO), gallium-doped zinc oxide, an aluminum nitride substrate, and silicon carbide; and composite substrates such as paper-resin composite materials including paper-phenol resin, paper-epoxy resin and paper-polyester resin, and glass-resin composite materials including glass fabric-epoxy resin, glass fabric-polyimide resin and glass fabric-fluororesin. Among these, a polyester resin substrate, a polyether imide resin substrate, a paper substrate, a glass substrate, and a glass fabric-epoxy substrate are preferably used.

The method for forming a coating film by applying the composition of the present invention to the substrate is not particularly limited and a known method can be adopted.

Examples of the coating method include a coating method using a double roll coater, a slit coater, an air knife coater, a wire bar coater, a slide hopper, a spray coater, a blade coater, a doctor coater, a squeeze coater, a reverse roll coater, a transfer roll coater, an extrusion coater, a curtain coater, a deep coater, a die coater or a gravure roll, a screen printing method, a dip coating method, a spray coating method, a spin coating method, and an ink jet method. Among these, a screen printing method and an ink jet method are preferable because the methods are simple and a large electroconductive film is easily produced.

The form of the coating is not particularly limited. The composition may be applied in the form of a plane covering the entire surface of the substrate or may be applied in the form of a pattern (for example, in the form of wiring or in the form of dots).

The amount of the electroconductive-film-forming composition applied to the substrate may be appropriately adjusted according to the desired thickness of the electroconductive film. However, usually, the thickness of the coating film is preferably 0.01 μm to 5,000 μm and more preferably 0.1 μm to 1,000 μm.

After the electroconductive-film-forming composition is applied to the substrate, a drying treatment for removing the solvent may be performed as required. It is preferable to remove the remaining solvent for the reason that minute cracks or voids caused by vaporization expansion of the solvent can be prevented from occurring in a heat treatment which will be described later. As a method for the drying treatment, a method using a hot air dryer or the like can be used.

<Heat Treatment Step>

This step is a step of forming an electroconductive film by performing a heat treatment on the coating film formed in the coating film forming step. The copper oxide particles and copper oxide on the surface of the copper particles in the coating film are reduced by the heat treatment and at the same time, the copper particles are fused via the copper oxide particles.

The heat treatment conditions are not particularly limited. However, the heating temperature is preferably 80° C. to 250° C. and more preferably 100° C. to 200° C. for the reason that the range of a substrate that can be used can be expanded. In addition, the heating time is preferably 5 minutes to 120 minutes and more preferably 10 minutes to 60 minutes.

The heating means is not particularly limited and known heating means such as an oven or a hot plate can be used.

In the present invention, the electroconductive film can be formed by a heat treatment at a relatively low temperature and thus it is advantageous in that the versatility of a substrate such as a resin substrate having a low glass transition temperature is high.

The atmosphere in which the heat treatment is performed is not particularly limited and examples thereof include an air atmosphere, an inert atmosphere or a reducing atmosphere. The inert atmosphere refers to, for example, an atmosphere which is filled with an inert gas such as argon, helium, neon, or nitrogen, and the reducing atmosphere refers to an atmosphere in which a reducing gas such as hydrogen, carbon monoxide, formic acid, or alcohol is present.

[Electroconductive Film]

The electroconductive film of the present invention is an electroconductive film that is produced by using the aforementioned composition of the present invention. In particular, an electroconductive film produced by the method including the aforementioned coating film forming step and heat treatment step is preferable.

The thickness of the electroconductive film is not particularly limited and the thickness is adjusted to be optimal according to the purpose of use. In particular, when the electroconductive film is used for a printed wiring substrate, the thickness is preferably 0.01 μm to 1,000 μm and more preferably 0.1 μm to 100 μm.

The thickness is a value (an average value) obtained by measuring the thickness of the electroconductive film at 3 or more arbitrary points and arithmetically averaging the values. The volume resistance value of the electroconductive film is preferably $2.0 \times 10^{-4}$ Ωcm or less from the viewpoint of conductive properties.

The volume resistance value can be calculated by measuring the surface resistance value of the electroconductive film by a four-probe method and then multiplying the obtained surface resistance value by the thickness.

The electroconductive film may be provided over the entire surface of the substrate or in a pattern. The patterned electroconductive film is useful as a conductor wiring (wiring) of a printed wiring substrate or the like. As a method for obtaining the patterned electroconductive film, a method of applying the electroconductive-film-forming composition to the substrate in a pattern and performing the heat treatment, or a method of etching the electroconductive film provided over the entire surface of the substrate in a pattern, and the like can be used.

The etching method is not particularly limited and known subtractive methods, semi-additive methods and the like can be adopted.

When the patterned electroconductive film is used as a multilayer wiring substrate, an insulating layer (insulating resin layer, interlayer insulating film, solder resist) may be further laminated on the surface of the patterned electroconductive film and wiring (metal pattern) may be further formed on the surface.

The material for the insulating film is not particularly limited and examples thereof include an epoxy resin, an aramid resin, a crystalline polyolefin resin, an amorphous polyolefin resin, a fluorine-containing resin (polytetrafluoroethylene, perfluorinated polyimide, perfluorinated amorphous resins, and the like), a polyimide resin, a polyether sulfone resin, a polyphenylene sulfide resin, a polyether ether ketone resin, a liquid crystal resin, and the like.

Among these, from the viewpoint of adhesiveness, dimensional stability, heat resistance, electric insulation, and the like, a material which contains an epoxy resin, a polyimide resin, or a liquid crystal resin is preferable, and a material which contains an epoxy resin is more preferable. Specific examples of the insulating layer include ABF GX-13 manufactured by Ajinomoto Fine-Techno Co., Inc., and the like.

In addition, a solder resist which is one of the materials for the insulating layer used for protecting wiring is described in detail in JP1998-204150A (JP-H10-204150A), JP2003-222993A, and the like and the materials described in the above can be applied to the present invention as required. Commercially available solder resists may be used, and specific examples thereof include PFR800 and PSR4000 (trade names) manufactured by TAIYO INK MFG CO., LTD., SR7200G manufactured by Hitachi Chemical Co., Ltd., and the like.

The substrate (substrate with the electroconductive film) having the obtained electroconductive film can be used for various purposes. For example, the substrate can be used for a printed wiring substrate, TFT, FPC, RFID, and the like.

EXAMPLES

Hereinafter, the present invention will be described in more detail using examples but the present invention is not limited to these examples.

Example 1

Copper particles (1200YP, average particle diameter: 3 μm, manufactured by MITSUI MINING & SMELTING CO., LTD.) (7.6 parts by mass), copper oxide particles (NanoTek CuO, copper (II) oxide particles (CuO particles), average particle diameter: 50 nm, manufactured by C. I. KASEI CO., LTD.) (7.6 parts by mass), glyceraldehyde (boiling point: 228° C., manufactured by Sigma-Aldrich Co. LLC.) (designated as A in Table 1) (38 parts by mass), palladium acetate (indicated as P in Table 1) (0.38 parts by mass), and water (SP value: 23.4 $(cal/cm^3)^{1/2}$) (46.4 parts by mass) were mixed and the mixture was treated for 5 minutes using a revolving and rotating mixer (Awa-tori Rentaro ARE-310, manufactured by THINKY CORPORATION). Thus, an electroconductive-film-forming composition was obtained.

Example 2

An electroconductive-film-forming composition was obtained in the same procedures as in Example 1 except that glucose (decomposition temperature: 205° C.) (designated as B in Table 1) (38 parts by mass) was used instead of using glyceraldehyde (38 parts by mass).

Example 3

An electroconductive-film-forming composition was obtained in the same procedures as in Example 1 except that trimethylolpropane (boiling point: 195° C.) (designated as C in Table 1) (38 parts by mass) was used instead of using glyceraldehyde (38 parts by mass).

Example 4

An electroconductive-film-forming composition was obtained in the same procedures as in Example 1 except that 1-decanol (boiling point: 233° C.) (designated as D in Table 1) (38 parts by mass) was used instead of using glyceraldehyde (38 parts by mass).

Example 5

An electroconductive-film-forming composition was obtained in the same procedures as in Example 1 except that sorbitol (boiling point: 296° C.) (designated as E in Table 1) (38 parts by mass) was used instead of using glyceraldehyde (38 parts by mass).

Example 6

An electroconductive-film-forming composition was obtained in the same procedures as in Example 1 except that ethylene glycol (boiling point: 197° C.) (designated as F in Table 1) (38 parts by mass) was used instead of using glyceraldehyde (38 parts by mass).

Example 7

An electroconductive-film-forming composition was obtained in the same procedures as in Example 3 except that a phenol resin (RESITOP PL-3224, manufactured by Gun Ei Chemical Industry Co., Ltd.) (designated as J in Table 1) (1 part by mass as a phenol resin) was mixed.

Example 8

An electroconductive-film-forming composition was obtained in the same procedures as in Example 3 except that a fine palladium particle dispersion liquid (manufactured by Wako Pure Chemical Industries, Ltd.) (designated as Q in Table 1) (0.38 parts by mass as fine palladium particles) was used instead of using palladium acetate (0.38 parts by mass).

Example 9

An electroconductive-film-forming composition was obtained in the same procedures as in Example 3 except that a fine platinum particle dispersion liquid (manufactured by Wako Pure Chemical Industries, Ltd.) (designated as R in Table 1) (0.38 parts by mass as fine platinum particles) was used instead of using palladium acetate (0.38 parts by mass).

Example 10

An electroconductive-film-forming composition was obtained in the same procedures as in Example 3 except that a fine nickel particle dispersion liquid (manufactured by Wako Pure Chemical Industries, Ltd.) (designated as S in Table 1) (0.38 parts by mass as fine nickel particles) was used instead of using palladium acetate (0.38 parts by mass).

Example 11

An electroconductive-film-forming composition was obtained in the same procedures as in Example 3 except that a 2% by mass acetone solution of palladium acetate (19 parts by mass) was used instead of using palladium acetate (0.38 parts by mass) and the formulating ratio of the water was changed from 46.4 parts by mass to 27.8 parts by mass. The SP value of the mixed solvent of water and acetone contained in the electroconductive-film-forming composition is 17.2.

Comparative Example 1

An electroconductive-film-forming composition was obtained in the same procedures as in Example 3 except that the formulating amount of the copper oxide was changed from 7.6 parts by mass to 2.53 parts by mass, the formulating amount of the trimethylolpropane was changed from 38 parts by mass to 12.7 parts by mass, and the formulating amount of the palladium acetate was changed from 0.38 parts by mass to 0.126 parts by mass.

Comparative Example 2

An electroconductive-film-forming composition was obtained in the same procedures as in Example 3 except that the formulating amount of the trimethylolpropane was changed from 38 parts by mass to 114 parts by mass.

Comparative Example 3

An electroconductive-film-forming composition was obtained in the same procedures as in Example 3 except that the formulating amount of the trimethylolpropane was changed from 38 parts by mass to 7.6 parts by mass.

Comparative Example 4

An electroconductive-film-forming composition was obtained in the same procedures as in Example 3 except that the formulating amount of palladium acetate was changed from 0.38 parts by mass to 1.52 parts by mass.

Comparative Example 5

An electroconductive-film-forming composition was obtained in the same procedures as in Example 3 except that palladium acetate was not formulated.

Comparative Example 6

An electroconductive-film-forming composition was obtained in the same procedures as in Example 3 except that a fine copper particle dispersion liquid (manufactured by IOX Co., Ltd.) (designated as T in Table 1) (0.38 parts by mass as fine copper particles) was used instead of using palladium acetate (0.38 parts by mass).

Comparative Example 7

An electroconductive-film-forming composition was obtained in the same procedures as in Example 3 except that copper oxide particles were not formulated.

(Production of Electroconductive Film)

Each of the obtained electroconductive-film-forming compositions (Examples 1 to 11 and Comparative Examples 1 to 7) was applied to a synthetic quartz substrate (manufactured by I.G.C.) using an application bar and thus a coating film was obtained. Then, the obtained coating film was subjected to a heat treatment (at 200° C. for 30 minutes) under a nitrogen atmosphere to obtain an electroconductive film.

(Conductivity)

The volume resistivity of the obtained electroconductive film was measured using a four-probe resistivity meter and then the conductivity thereof was evaluated based on the criteria below. The results are shown together in Table 1.

Grades AA or A to C are preferable levels, the grade AA, A or B is a more preferable level, the grade AA or A is a still more preferable level, and the grade AA is a particularly preferable level for practical application.

AA: The void volume is less than 5%.
A: The void volume is 5% or more and less than 15%.
B: The void volume is 15% or more and less than 30%.
C: The void volume is 30% or more and less than 50%.
D: The void volume is 50% or more.

TABLE 1

| Table 1 | Copper Particle diameter [nm] | Copper Part by mass | Copper oxide Particle diameter [nm] | Copper oxide Part by mass | Reducing agent Type | Reducing agent Part by mass | Resin Type | Resin Parts by mass | Metal Catalyst Type | Metal Catalyst Part by mass | Solvent | Copper oxide/ Copper [% by mass] | Reducing agent/ Copper oxide [mol %] | Metal catalyst/ Copper oxide [% by mass] | Conductivity | Void Volume |
|---|---|---|---|---|---|---|---|---|---|---|---|---|---|---|---|---|
| Example 1 | 3000 | 7.6 | 50 | 7.6 | A | 38 | — | 0 | P | 0.38 | Water | 100.0 | 442 | 5.0 | B | A |
| Example 2 | 3000 | 7.6 | 50 | 7.6 | B | 38 | — | 0 | P | 0.38 | Water | 100.0 | 221 | 5.0 | B | A |
| Example 3 | 3000 | 7.6 | 50 | 7.6 | C | 38 | — | 0 | P | 0.38 | Water | 100.0 | 296 | 5.0 | A | A |
| Example 4 | 3000 | 7.6 | 50 | 7.6 | D | 38 | — | 0 | P | 0.38 | Water | 100.0 | 251 | 5.0 | C | B |
| Example 5 | 3000 | 7.6 | 50 | 7.6 | E | 38 | — | 0 | P | 0.38 | Water | 100.0 | 218 | 5.0 | B | B |
| Example 6 | 3000 | 7.6 | 50 | 7.6 | F | 38 | — | 0 | P | 0.38 | Water | 100.0 | 641 | 5.0 | A | A |
| Example 7 | 3000 | 7.6 | 50 | 7.6 | C | 38 | J | 1 | P | 0.38 | Water | 100.0 | 296 | 5.0 | A | AA |
| Example 8 | 3000 | 7.6 | 50 | 7.6 | C | 38 | — | 0 | Q | 0.38 | Water | 100.0 | 296 | 5.0 | B | A |
| Example 9 | 3000 | 7.6 | 50 | 7.6 | C | 38 | — | 0 | R | 0.38 | Water | 100.0 | 296 | 5.0 | B | A |
| Example 10 | 3000 | 7.6 | 50 | 7.6 | C | 38 | — | 0 | S | 0.38 | Water | 100.0 | 296 | 5.0 | B | A |
| Example 11 | 3000 | 7.6 | 50 | 7.6 | C | 38 | — | 0 | P | 0.38 | Water/ Acetone | 100.0 | 296 | 5.0 | AA | A |
| Comparative Example 1 | 3000 | 7.6 | 50 | 2.53 | C | 12.7 | — | 0 | P | 0.126 | Water | 33.3 | 298 | 5.0 | D | C |
| Comparative Example 2 | 3000 | 7.6 | 50 | 7.6 | C | 114 | — | 0 | P | 0.38 | Water | 100.0 | 889 | 5.0 | D | C |
| Comparative Example 3 | 3000 | 7.6 | 50 | 7.6 | C | 7.6 | — | 0 | P | 0.38 | Water | 100.0 | 59 | 5.0 | E | C |
| Comparative Example 4 | 3000 | 7.6 | 50 | 7.6 | C | 38 | — | 0 | P | 1.52 | Water | 100.0 | 296 | 20.0 | E | C |
| Comparative Example 5 | 3000 | 7.6 | 50 | 7.6 | C | 38 | — | 0 | — | 0 | Water | 100.0 | 296 | 0.0 | E | C |
| Comparative Example 6 | 3000 | 7.6 | 50 | 7.6 | C | 38 | — | 0 | T | 0.38 | Water | 100.0 | 296 | 5.0 | E | D |
| Comparative Example 7 | 3000 | 7.6 | — | 0 | C | 38 | — | 0 | P | 0.38 | Water | 0.0 | — | — | E | D |

AA: The volume resistivity is less than $5 \times 10^{-5}$ $\Omega \cdot cm$.
A: The volume resistivity is $5 \times 10^{-5}$ $\Omega \cdot cm$ or more and less than $1 \times 10^{-4}$ $\Omega \cdot cm$.
B: The volume resistivity is $1 \times 10^{-4}$ $\Omega \cdot cm$ or more and less than $5 \times 10^{-4}$ $\Omega \cdot cm$.
C: The volume resistivity is $5 \times 10^{-4}$ $\Omega \cdot cm$ or more and less than $1 \times 10^{-3}$ $\Omega \cdot cm$.
D: The volume resistivity is $1 \times 10^{-3}$ $\Omega \cdot cm$ or more.

(Void Volume)

The obtained electroconductive film was subjected to FIB machining by Helios 400S type FIB/SEM-EDS combination system (manufactured by FEI Company) to perform sectional SEM observation. The obtained sectional SEM photograph was binarized with white and black colors by adjusting the threshold value using image software ("Adobe Photoshop" produced by Adobe Systems Inc.) and the void volume was calculated from a number ratio between white dots and black dots. The calculated void volume was evaluated based on the criteria below. The results are shown together in Table 1. The grade AA, A or B is a preferable level, the grade AA or A is a more preferable level, and the grade AA is a still more preferable level for practical application.

As seen from Table 1, all of the electroconductive films obtained from the compositions of examples of the present application exhibited excellent conductivity and had few voids.

In addition, in comparison of Examples 1 to 6, the electroconductive films obtained from the compositions of Examples 1 to 3, 5, and 6 in which the reducing agent was a compound having two or more hydroxy groups in a molecule exhibited further excellent conductivity. Among these, the electroconductive films obtained from the compositions of Examples 3 and 6 in which the reducing agent was a "compound having two or more hydroxy groups in a molecule without a carbonyl group and having a boiling point of 250° C. or lower" exhibited still further excellent conductivity.

In comparison of Examples 3 and 7, the electroconductive film obtained from the composition of Example 7 containing a thermosetting resin had fewer voids.

Further, in comparison of Examples 3 and 8, the electroconductive film obtained from the composition of Example 3 in which the metal catalyst was a salt compound exhibited still further excellent conductivity.

In addition, in comparison of Examples 3 and 11, the electroconductive film obtained from the composition of Example 11 in which the solubility parameter of the solvent was 10 $(cal/cm^3)^{1/2}$ to 20 $(cal/cm^3)^{1/2}$ exhibited further excellent conductivity.

On the other hand, all of the electroconductive films obtained from the compositions of Comparative Example 7 in which the composition did not contain copper oxide particles, Comparative Example 1 in which the composition contained copper oxide particles but the content of the copper oxide particles was less than 50% by mass with respect to the content of the copper particles, Comparative Example 2 in which the content of the reducing agent was more than 800 mol % with respect to the content of the copper oxide particles, Comparative Example 3 in which the content of the reducing agent was less than 100 mol % with respect to the content of the copper oxide particles, Comparative Examples 5 and 6 in which the composition did not contain a metal catalyst including metals other than copper, and Comparative Example 4 in which the composition contained a metal catalyst including metals other than copper but the content of the metal catalyst was more than 10% by mass with respect to the content of the copper oxide particles exhibited insufficient conductivity and a large number of voids were observed.

What is claimed is:

1. An electroconductive-film-forming composition comprising:
    copper particles having an average particle diameter of 1 nm to 10 μm;
    copper oxide particles having an average particle diameter of 1 nm to 500 nm;
    a reducing agent having a hydroxy group;
    a metal catalyst including metals other than copper; and
    a solvent,
    wherein the content of the copper oxide particles is 50% by mass to 300% by mass with respect to the content of the copper particles,
    the content of the reducing agent is 200 mol % to 700 mol % with respect to the content of the copper oxide particles, and
    the content of the metal catalyst is 10% by mass or less with respect to the content of the copper oxide particles.

2. The electroconductive-film-forming composition according to claim 1,
    wherein the reducing agent is a compound having two or more hydroxy groups in a molecule.

3. The electroconductive-film-forming composition according to claim 2,
    wherein the boiling point of the reducing agent is 250° C. or lower and the reducing agent is a compound represented by Formula (1) or (2) below:

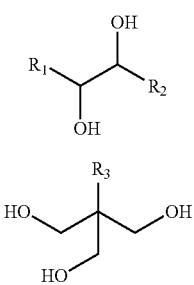

Formula (1)

Formula (2)

wherein, in Formulae (1) and (2), $R_1$, $R_2$ and $R_3$ each independently represent a hydrogen atom, an alkyl group, an alkoxy group, a hydroxyalkyl group, or an alkoxyalkyl group, and $R_1$, $R_2$ and $R_3$ do not contain an aldehyde group or a carbonyl group.

4. The electroconductive-film-forming composition according to claim 3,
    wherein the metal catalyst is a metal catalyst including at least one metal selected from the group consisting of palladium, platinum, nickel, and silver.

5. The electroconductive-film-forming composition according to claim 3,
    wherein the metal catalyst is a salt compound.

6. The electroconductive-film-forming composition according to claim 3,
    wherein the solubility parameter (SP value) of the solvent is 10 $(cal/cm^3)^{1/2}$ to 20 $(cal/cm^3)^{1/2}$.

7. The electroconductive-film-forming composition according to claim 3, further comprising:
    a resin.

8. The electroconductive-film-forming composition according to claim 2,
    wherein the metal catalyst is a metal catalyst including at least one metal selected from the group consisting of palladium, platinum, nickel, and silver.

9. The electroconductive-film-forming composition according to claim 2,
    wherein the metal catalyst is a salt compound.

10. The electroconductive-film-forming composition according to claim 2,
    wherein the solubility parameter (SP value) of the solvent is 10 $(cal/cm^3)^{1/2}$ to 20 $(cal/cm^3)^{1/2}$.

11. The electroconductive-film-forming composition according to claim 2, further comprising:
    a resin.

12. The electroconductive-film-forming composition according to claim 1,
    wherein the metal catalyst is a metal catalyst including at least one metal selected from the group consisting of palladium, platinum, nickel, and silver.

13. The electroconductive-film-forming composition according to claim 12,
    wherein the metal catalyst is a salt compound.

14. The electroconductive-film-forming composition according to claim 12,
    wherein the solubility parameter (SP value) of the solvent is 10 $(cal/cm^3)^{1/2}$ to 20 $(cal/cm^3)^{1/2}$.

15. The electroconductive-film-forming composition according to claim 1,
    wherein the metal catalyst is a salt compound.

16. The electroconductive-film-forming composition according to claim 1,
    wherein the solubility parameter (SP value) of the solvent is 10 $(cal/cm^3)^{1/2}$ to 20 $(cal/cm^3)^{1/2}$.

17. The electroconductive-film-forming composition according to claim 1, further comprising:
    a resin.

18. The electroconductive-film-forming composition according to claim 17,
    wherein the resin is a thermosetting resin.

19. A method for producing an electroconductive film comprising:
    a coating film forming step of forming a coating film by applying the electroconductive-film-forming composition according to claim 1 to a substrate; and
    a heat treatment step of forming an electroconductive film by subjecting the coating film to a heat treatment.

20. The method for producing an electroconductive film according to claim 19, wherein the temperature of the heat treatment is 200° C. or lower.

\* \* \* \* \*